(12) United States Patent
Yamamoto et al.

(10) Patent No.: US 9,921,481 B2
(45) Date of Patent: Mar. 20, 2018

(54) FINE RESIST PATTERN-FORMING COMPOSITION AND PATTERN FORMING METHOD USING SAME

(71) Applicant: AZ ELECTRONIC MATERIALS (LUXEMBOURG) S.A.R.L., Somerville, NJ (US)

(72) Inventors: Kazuma Yamamoto, Shizuoka (JP); Yoshihiro Miyamoto, Shizuoka (JP); Takashi Sekito, Shizuoka (JP); Tatsuro Nagahara, Shizuoka (JP)

(73) Assignee: AZ Electronic Materials (Luxembourg) S.à r.l., Luxembourg (LU)

( * ) Notice: Subject to any disclaimer, the term of this patent is extended or adjusted under 35 U.S.C. 154(b) by 57 days.

(21) Appl. No.: 14/768,660

(22) PCT Filed: Feb. 26, 2014

(86) PCT No.: PCT/JP2014/054657
§ 371 (c)(1),
(2) Date: Aug. 18, 2015

(87) PCT Pub. No.: WO2014/132992
PCT Pub. Date: Sep. 4, 2014

(65) Prior Publication Data
US 2016/0002494 A1 Jan. 7, 2016

(30) Foreign Application Priority Data

Feb. 26, 2013 (JP) ................... 2013-036029

(51) Int. Cl.
| | | |
|---|---|---|
| *G03F 7/40* | (2006.01) | |
| *G03F 7/32* | (2006.01) | |
| *G03F 7/20* | (2006.01) | |
| *G03F 7/039* | (2006.01) | |
| *C09D 139/02* | (2006.01) | |
| *C09D 139/04* | (2006.01) | |

(52) U.S. Cl.
CPC ............ *G03F 7/40* (2013.01); *C09D 139/02* (2013.01); *C09D 139/04* (2013.01); *G03F 7/0392* (2013.01); *G03F 7/20* (2013.01); *G03F 7/325* (2013.01); *G03F 7/405* (2013.01)

(58) Field of Classification Search
None
See application file for complete search history.

(56) References Cited

U.S. PATENT DOCUMENTS

| | | | |
|---|---|---|---|
| 7,745,093 B2 | 6/2010 | Nishibe et al. | |
| 8,852,848 B2 | 10/2014 | Wu et al. | |
| 2004/0224866 A1* | 11/2004 | Matsunaga | C11D 3/0073 510/175 |
| 2005/0003114 A1* | 1/2005 | Nakano | B41M 5/52 428/32.34 |
| 2006/0046205 A1 | 3/2006 | Hah et al. | |
| 2006/0088788 A1 | 4/2006 | Kudo et al. | |
| 2007/0048659 A1* | 3/2007 | Namiki | G03F 7/40 430/270.1 |
| 2010/0239984 A1 | 9/2010 | Tsubaki | |
| 2011/0242201 A1* | 10/2011 | Kato | B41J 2/2114 347/21 |
| 2012/0028195 A1 | 2/2012 | Wu et al. | |
| 2012/0148957 A1* | 6/2012 | Enomoto | G03F 7/0382 430/285.1 |
| 2012/0276483 A1* | 11/2012 | Ogihara | G03F 7/0752 430/319 |
| 2013/0017501 A1 | 1/2013 | Nakamura et al. | |
| 2013/0157197 A1* | 6/2013 | Komuro | G03F 7/027 430/285.1 |

(Continued)

FOREIGN PATENT DOCUMENTS

| | | |
|---|---|---|
| EP | 2733534 A1 | 5/2014 |
| JP | 10-73927 A | 3/1998 |
| JP | 2003-84459 A | 3/2003 |
| JP | 2005-300853 A | 10/2005 |
| JP | 2006-48035 A | 2/2006 |
| JP | 2008-518260 A | 5/2008 |
| JP | 2008-310314 A | 12/2008 |

(Continued)

OTHER PUBLICATIONS

Emmanuel Stefanis et al., "Prediction of Hansen Solubility Parameters with a New Group-Contribution Method", Int J Thermophys, 29, pp. 569-pp. 585 (2008).
Extended European Search Report, PCT/JP2014/054657, dated Jul. 3, 2017, corresponds to U.S. Appl. No. 14/768,660.

*Primary Examiner* — Sin J Lee
(74) *Attorney, Agent, or Firm* — Francis M. Houlihan

(57) ABSTRACT

The present invention provides a composition enabling to form a fine negative photoresist pattern free from troubles such as surface roughness, bridge defects or unresolved defects, and the invention also provides a pattern formation method employing that composition. The composition is used for miniaturizing a resist pattern by applying to a negative resist pattern from a chemically amplified resist composition and fattening the resist pattern. This composition comprises a polymer comprising a repeating unit having an amino group or a polymer mixture, and a solvent, and further comprises a specific amount of an acid or indicates a specific pH value. The polymer mixture comprises polymers whose HSP distance, determined from Hansen solubility parameter, is 3 or more. In the pattern formation method, the composition is cast on a negative photoresist pattern beforehand obtained by development with an organic solvent developer and is then heated to form a fine pattern.

12 Claims, No Drawings

(56) References Cited

U.S. PATENT DOCUMENTS

2014/0127478 A1* 5/2014 Okamura .............. C08F 226/02
428/195.1

FOREIGN PATENT DOCUMENTS

| JP | 2001-228616 A | 8/2011 |
| JP | 2013-3155 A | 1/2013 |
| WO | WO 2013/008912 A1 * | 1/2013 |

* cited by examiner

FINE RESIST PATTERN-FORMING COMPOSITION AND PATTERN FORMING METHOD USING SAME

This application is a United States National Stage Patent Application under 35 U.S.C. § 371 of International Patent Application No. PCT/JP2014/054657, filed Feb. 26, 2014, which claims priority to Japanese Patent Application No. 2013-036029, filed Feb. 26, 2013, the contents of which are being hereby incorporated herein by reference.

TECHNICAL FIELD

The present invention relates to a composition for obtaining a fine resist pattern miniaturized by fattening or thickening a beforehand formed resist pattern in a production process of semiconductor devices and the like, and this invention also relates to a pattern formation method employing that composition.

BACKGROUND ART

In manufacturing semiconductor devices, resist patterns have been required to be made minute enough to meet increased integration density and highly accelerated processing speed in LSIs. Resist patterns are normally formed in photo-lithographic processes using, for example, positive-working type resists, whose solubilities to alkali developers are increased by exposure to light. Accordingly, the resists in the areas exposed to light are removed with the alkali developers to form positive resist patterns. However, the fineness of the resultant patterns greatly depends on the exposure methods and light sources, and hence in order to stably produce fine resist patterns, a huge investment is necessary to install special and expensive facilities and equipments needed for the exposure methods and light sources capable of ensuring the fineness.

In view of that, there are various techniques studied for further miniaturizing resist patterns formed beforehand by conventional methods. For example, they include a practical method in which a resist pattern stably produced by a conventional method is coated with a composition comprising a water-soluble resin and optional additives so as to fatten or thicken the resist pattern and thereby to decrease the diameter of holes and/or the width of furrow lines separating the ridges in the pattern.

Specifically, the following processes and composition are known:
(1) a process comprising the steps of
    coating a conventionally formed resist pattern with a composition crosslinkable by an acid,
    heating the resist pattern to diffuse the acid contained in the resist so that the composition on the resist may be crosslinked to form a crosslinked layer at the interface therebetween as a covering layer of the resist pattern, and
    removing the uncrosslinked composition with a developer to fatten or thicken the resist pattern and thereby to decrease the diameter of holes and/or the width of furrow lines separating the ridges in the pattern (see, Patent documents 1 and 2);
(2) a process comprising the steps of
    coating a conventionally formed resist pattern with an aqueous solution of a copolymer derived from (meth)acrylic acid monomers and water-soluble vinyl monomers, and
    heating the resist pattern to shrink and thereby to become finer (see, Patent document 3); and
(3) a water-soluble coating composition which comprises a polymer containing amino groups, in particular, primary amines and which is used for covering a photoresist pattern (see, Patent document 4).

PRIOR ART DOCUMENTS

Patent Documents

[Patent document 1] Japanese Patent Laid-Open No. 10(1998)-73927
[Patent document 2] Japanese Patent Laid-Open No. 2005-300853
[Patent document 3] Japanese Patent Laid-Open No. 2003-84459
[Patent document 4] Japanese Patent Laid-Open No. 2008-518260

Non-Patent Documents

[Non-Patent document 1] Emmanuel Stefanis and Costas Panayiotou, Int. J. Thermophys (2008) 29:568-585

DISCLOSURE OF INVENTION

Problem to be Solved by the Invention

However, patterns formed by the known processes often suffer from troubles such as surface roughness, bridge defects and unresolved defects, and accordingly it has been desired to provide a composition that enables to stably produce a miniaturized pattern having excellent properties.

In consideration of the above problem, it is an object of the present invention to provide a composition which can be used for coating to fatten or thicken a negative resist pattern beforehand formed by developing a chemically amplified positive-working photoresist with an organic solvent developer and thereby which enables to stably form a fine pattern. Further, it is another object of the present invention to provide a pattern formation method employing that composition.

Means for Solving Problem

The present invention resides in the first fine pattern-forming composition used for miniaturizing a resist pattern by applying to a negative resist pattern formed by using a chemically amplified resist composition and fattening the resist pattern, comprising
    a polymer comprising a repeating unit having an amino group,
    a solvent, and
    an acid in an amount of more than 50 wt % based on the weight of said polymer.

The present invention resides in the second fine pattern-forming composition used for miniaturizing a resist pattern by applying to a negative resist pattern formed by using a chemically amplified resist composition and fattening the resist pattern, comprising
    a polymer A, comprising a repeating unit having an amino group,
    a polymer B, which is different from said polymer A and may or may not comprise repeating unit having an amino group,
    a solvent, and
    an acid in an amount of more than 10 wt % based on the weight of said polymer, wherein HSP distance, which is determined from Hansen solubility parameter of said polymer A and said polymer B, is 3 or more.

The present invention resides in the third fine pattern-forming composition used for miniaturizing a resist pattern by applying to a negative resist pattern formed by using a chemically amplified resist composition and fattening the resist pattern, comprising a polymer A, comprising a repeating unit having an amino group, a polymer B, which is different from said polymer A and may or may not comprise repeating unit having an amino group, and a solvent, wherein pH of said composition is 5 to 10 and
HSP distance, which is determined from Hansen solubility parameter of said polymer A and said polymer B, is 3 or more.

The present invention also resides in the first method for forming a negative resist pattern, comprising the steps of:

coating a semiconductor substrate with a chemically amplified photoresist composition, to form a photoresist layer;

exposing said semiconductor substrate coated with said photoresist layer;

developing said photoresist layer with an organic solvent developer after said exposing step, to form a photoresist pattern;

coating said photoresist pattern with a fine pattern-forming composition containing a polymer comprising a repeating unit having an amino group, an acid in an amount of more than 50 wt % based on the weight of said polymer, and a solvent;

heating the coated photoresist pattern; and washing to remove excess of the fine pattern-forming composition.

The present invention also resides in the second method for forming a negative resist pattern, comprising the steps of:

coating a semiconductor substrate with a chemically amplified photoresist composition, to form a photoresist layer;

exposing said semiconductor substrate coated with said photoresist layer;

developing said photoresist layer with an organic solvent developer after said exposing step, to form a photoresist pattern;

coating said photoresist pattern with a fine pattern-forming composition;

heating the coated photoresist pattern; and washing to remove excess of the fine pattern-forming composition, wherein said fine pattern-forming composition comprises a polymer A comprising a repeating unit having an amino group, a polymer B, which is different from said polymer A and may or may not comprise repeating unit having an amino group, a solvent, and an acid in an amount of more than 10 wt % based on the weight of said polymer, where HSP distance, which is determined from Hansen solubility parameter of said polymer A and said polymer B, is 3 or more.

The present invention also resides in the third method for forming a negative resist pattern, comprising the steps of:

coating a semiconductor substrate with a chemically amplified photoresist composition, to form a photoresist layer;

exposing said semiconductor substrate coated with said photoresist layer;

developing said photoresist layer with an organic solvent developer after said exposing step, to form a photoresist pattern;

coating said photoresist pattern with a fine pattern-forming composition;

heating the coated photoresist pattern; and washing to remove excess of the fine pattern-forming composition, wherein said fine pattern-forming composition comprises a polymer A comprising a repeating unit having an amino group, a polymer B, which is different from said polymer A and may or may not comprise repeating unit having an amino group, and a solvent, where pH of said composition is 5 to 10,
HSP distance, which is determined from Hansen solubility parameter of said polymer A and said polymer B, is 3 or more.

Effect of the Invention

The present invention enables to obtain a fine negative photoresist pattern free from troubles such as surface roughness, bridge defects, unresolved defects or ununiformity of increased pattern width.

BEST MODE FOR CARRYING OUT THE INVENTION

Embodiments according to the present invention are described below in detail.

The First Fine Pattern-Forming Composition

The fine pattern-forming composition of the present invention comprises a polymer comprising a repeating unit having an amino group, a solvent, and an acid. Thus, the polymer used in the present invention has an amino group. Here, the "amino group" means a primary amino group (—$NH_2$), a secondary amino group (—NHR) or a tertiary amino group (—NRR'). Further, in the present specification, the term "amino group" includes a group, such as —N=, in which a nitrogen atom connects to an adjacent atom via a double bond. The amino group may be positioned either at the main chain of the polymer or at the side chain of the repeating unit.

When the fine pattern-forming composition comprising the above polymer is brought into contact with a resist pattern developed in the pattern formation process, the polymer intermixes with the resist pattern and/or the composition attaches onto the surface of the pattern. As a result, the resist pattern is fattened or thickened to miniaturize the gaps among the ridge lines in the pattern. In addition, since having the amino group, the polymer has such favorable basicity as to inhibit an excessive reaction with hydroxyl groups and the like contained in the resin of the photoresist pattern. Because of that, the troubles such as surface roughness and defects are thought to be reduced.

There are various known polymers comprising repeating units having the above amino groups. Examples of the polymers comprising repeating units having primary amino groups at the side chains include polyvinylamine, polyallylamine, polydiallylamine, polyethyleneimine, and poly(allylamine-co-diallylamine). Further, examples of the polymers having an amino group having a cyclic structure include polyvinylpyrrolidone.

Examples of the polymers having the amino groups at the main chains include polyalkyleneimines such as polyethyleneimine and polypropyleneimine. It is also possible to adopt a polymer having an amido bond —NH—C(=O)— in the main chain.

Further, as the polymer in the fine pattern-forming composition of the present invention, it is still also possible to adopt a polymer having a structure in which a nitrogen atom connects to an adjacent atom via a double bond on one side and also connects to another adjacent atom via a single bond on the other side. This structure may be included either in the side chain or in the main chain of the polymer. However, the structure is typically included in the side chain as a part of a heterocyclic ring. Examples of the heterocyclic ring having that structure include imidazole ring, oxazole ring, pyridine ring, and bipyridine ring. Examples of those polymers include polyvinylimidazole.

The polymer used in the present invention can be properly selected from the above in view of availability and the kind of the resist pattern. Among the above, polyvinylamine, polyallylamine and poly(allyl-amine-co-diallylamine) are preferred because they give favorable effects on coatability and on reduction of the pattern.

As the polymer contained in the composition of the present invention, it is yet also possible to adopt a copolymer comprising repeating units having no amino groups in such an amount as not to impair the effect of the present invention. For example, the copolymer may comprise copolymerized units derived from polyacrylic acid, polymethacrylic acid or polyvinyl alcohol.

However, if the polymer comprises too many repeating units having no amino groups, the affinity between the polymer and the resin in the photoresist cannot be kept enough to obtain the effect of the present invention. In view of that, the amount of the repeating units having no amino groups is preferably 10 mol % or less, more preferably 5 mol % or less, based on the total repeating units of the polymer.

In the present invention, there are no particular restrictions on the molecular weight of the polymer having the amino group, but the weight average molecular weight thereof is generally 3,000 to 200,000, preferably 5,000 to 150,000. Here, the "weight average molecular weight" means a polystyrene-reduced weight average molecular weight measured by gel permeation chromatography.

The fine pattern-forming composition of the present invention may comprise a polymer having no amino group.

The solvent is preferably water, which is more preferably purified by distillation, ion-exchange treatment, filtration, various kinds of adsorption treatment or the like to remove organic impurities, metal ions and the like. It is particularly preferred to use pure water. Further, organic solvent, which does not dissolve or denature resist pattern, may be used. Examples of the organic solvent include n-butyl alcohol and 2-heptanone. Furthermore, mixed solvent including water and a small amount of organic solvent for the purpose of improving wettability as a co-solvent may be used. Examples of the organic solvent include: alcohols such as methyl alcohol, ethyl alcohol, and propyleneglycol monomethyl ether; ketones such as acetone, and methyl ethyl ketone; and esters such as ethyl lactate and ethyl acetate.

As described above, the fine pattern-forming composition of the present invention comprises a polymer having a particular structure. The content of the polymer is freely selected according to the size and kind of the resist pattern and also to the aimed pattern fineness. However, the polymer having a particular structure is contained in an amount of generally 0.1 to 10 wt %, preferably 1.0 to 7.0 wt % based on the total weight of the composition.

In addition, the fine pattern-forming composition of the present invention further contains an acid. There are no particular restrictions on the acid unless it gives unfavorable effects to the resist pattern. The acid can be selected from inorganic or organic acids. Examples of the organic acids include: carboxylic acids, such as acetic acid, methoxyacetic acid, glycolic acid, and glutaric acid; and sulfonic acids, such as methanesulfonic acid, ethanesulfonic acid, 2-aminoethanesulfonic acid, trifluoromethanesulfonic acid, p-toluenesulfonic acid, and 10-camphorsulfonic acid. Among them, methanesulfonic acid and p-toluenesulfonic acid are particularly preferred because they are highly soluble in water and have such high boiling points that they hardly volatilize from the coat when heated in the production process. Examples of the inorganic acids include sulfuric acid, nitric acid, and hydrochloric acid. Among them, sulfuric acid and nitric acid are preferred because they hardly introduce elements largely affecting electric properties and hence have excellent affinity with semiconductor processing.

The present inventors have found that the coatability can be improved by adding a small amount of acid into conventional fine pattern-forming compositions. However, if the acid is added in a very large amount, unknown effects can be obtained. Specifically, the fine pattern-forming composition of the present invention contains a very large amount of the acid, and thereby it becomes possible to improve the resultant pattern in surface roughness and to keep the pattern having the same roughness as before treated with the composition. If the composition contains the acid in an amount smaller than the regulated range, the pattern roughness is impaired to form defects causing troubles in manufacturing semiconductor devices. The composition, therefore, contains the acid in an amount of necessarily more than 50 wt %, preferably 60 wt % or more, based on the total weight of the polymer having the amino group. On the other hand, however, in order to keep a sufficient level of coatability and also to fully obtain the pattern-miniaturizing effect of the composition, the amount of the acid is preferably 200 wt % or less based on the total weight of the polymer having the amino group. That is because, if the acid content is too large, the pattern-miniaturizing effect is often hardly obtained.

The fine pattern-forming composition generally has a pH value of preferably 2 to 11, more preferably 3 to 10. If the pH value is less than 2 or more than 11, the composition often dissolves the photoresist pattern to roughen the surface thereof. It is hence preferred to adjust the pH value properly. To adjust the pH value, the type of polymer having an amino group can be changed or other constituent can be selected. However, adding acid is convenient for the adjustment and it can decrease the number of defects on a wafer after the treatment.

Further, the fine pattern-forming composition of the present invention can contain other additives, if necessary. Examples of the additives include surfactants, germicides, antibacterial agents, antiseptic agents and anti-mold agents. Among them, in view of the coatability of the composition, the composition preferably contains a surfactant. The additives give no essential effects to the performance of the composition, and the amount thereof is normally 1 wt % or less, preferably 0.1 wt % or less, more preferably 0.06 wt % or less, based on the total weight of the composition.

The Second Fine Pattern-Forming Composition

The second fine pattern-forming composition of the present invention comprises a polymer A, a polymer B which is different from the polymer A, a solvent and an acid. Here, said polymer A is the polymer having an amino group, previously described in the paragraph of the first fine pattern-forming. The polymer B is different from the polymer A and there is a difference between their polarities. Further, the polymer B, required to have a structure different from that of the polymer A, may or may not have an amino group.

The difference between polarities of polymers can be calculated by Hansen solubility parameters. Specifically, by using Hansen space coordinates ($\delta D_A$, $\delta P_A$, $\delta H_A$) of the polymer A and Hansen space coordinates ($\delta D_B$, $\delta P_B$, $\delta H_B$) of the polymer B, the following equation;

$$\text{HSP distance} = [(\delta D_A - \delta D_B)^2 + (\delta H_A - \delta P_B)^2 + (\delta H_A - \delta H_B)^2]^{1/2}$$

determines the difference between polarities of the polymers. HSP distance of the polymer A and the polymer B in the second fine pattern-forming composition of the present invention is 3 or more, preferably 4 or more.

Thus, large difference between polarities of two polymers brings about effects of the invention. The reason of this is not fully understood, it is presumed as follows.

In the fine processing of a resist pattern, when density of resist pattern is varied, increased width of pattern obtained by applying the fine pattern-forming composition may vary. This reason is thought to be due to the differences in removal rate of the protection group of the photoresist polymer in the pattern. Specifically, places where protection groups are deprotected by ultraviolet light or EUV irradiation become insoluble in a developer and remain as pattern in the patterning process using nega type photoresist. This amount of removed protection group varies depending on the size and density of pattern. Thus, deprotected polymers having carboxylic groups at terminal are acidized.

On the other hand, when the fine pattern-forming composition comprises a polymer having an amino group, the amino group often shows basic and large amount of the of removed protection group tends to promote mixing with photoresist. However, as previously mentioned, the amount of removed protection group in the pattern varies depending on the size and density of pattern. Thus, the fine pattern-forming composition may soak into or attach onto photoresist non-uniformly. As a result, increased line width may become non-uniform and further step to adjust this would be required in the process of manufacturing semiconductor devices.

It has been found that the non-uniformity of increased line width can be improved by using polymers that their polarities are properly varied. Specifically, the fine pattern-forming composition comprises two or more polymers having different polarities. Thus, the polymer having high polarity preferentially attaches onto the largely deprotected pattern and the polymer having low polarity attaches into the less protected pattern. Consequently, the non-uniformity of increased line width is thought to be improved.

For these reasons, the polymer B is required to have different polarity from the polymer A, but the structure is not limited. Thus, it may or may not have an amino group.

The Hansen solubility parameters can be calculated by Stefanis-Panayiotou formula (Non-Patent Document 1). The Hansen solubility parameters of some polymers are as follows.

$\delta D$: energy derived from the dispersion forces between molecules
$\delta P$: energy derived from the polar forces between molecules
$\delta H$: energy derived from the hydrogen bonding forces between molecules Name of substance ($\delta D$, $\delta P$, $\delta H$)
polyvinylamine (14.3, 7.8, 13.4)
polyallylamine (14.8, 6.4, 11.2)
polyvinylimidazole (20.1, 16.1, 10.8)
polymethacrylic acid (16.7, 6.0, 12.4)
polyethyleneimine (16.6, 6.0, 8.6)
polyamideamine (19.9, 9.8, 10.6)
polyethylacrylate (16.3, 3.3, 6.8)
polypropylacrylate (16.3, 2.6, 6.3)
polyacryloylmorpholine (18.5, 8.8, 10.0)
polyvinyloxazoline (17.9, 8.4, 0.0)
polyvinylpyrrolidone (16.9, 10.3, 7.3)

For example, when polyvinylamine is selected as the polymer A and following polymers as the polymer B, HSP distance are as follows.
polyallylamine 2.66
polyvinylimidazole 10.45
polymethacrylic acid 3.16
polyethylenimine 5.62
polyamideamine 6.57
polyethylacrylate 8.23
polypropylacrylate 9.02
polyacryloylmorpholine 5.50
polyvinyloxazoline 13.89
polyvinylpyrrolidone 7.09

In the present invention, it may further comprise another polymer different from the polymer A and the polymer B. Here, HSP distance between another polymer and the polymer A and HSP distance between another polymer and the polymer B are not limited. Another polymer may or may not have an amino group. That is, as long as the polymer A and the polymer B, their HSP distance is 3 or more, are comprised, any polymer can be comprised. Mixture ratio of polymers is not limited unless they impair the effect of the present invention.

Further, the second fine pattern-forming composition can comprise the same acid and other additives as the one described above in the first fine pattern-forming composition. The additive amount except for the acid is the same as the first fine pattern-forming composition. The content of the acid may be lower than that of the first fine pattern-forming composition. This is because enough fine pattern-forming can be performed uniformly by mixture of polymers even if the content of the acid is low, as previously described. Specifically, the second fine pattern-forming composition contains the acid in an amount of 10 wt % or more, preferably 20 wt % or more, more preferably 30 wt % or more, based on the total weight of the polymer comprising a repeating unit having an amino group in the composition. In the second fine pattern-forming composition, pH is not limited unless the content of the acid is in that range, described above, but pH value is preferably 2 to 11, more preferably 5 to 10, particularly preferably 6 to 9.5.

The Third Fine Pattern-Forming Composition

The third fine pattern-forming composition of the present invention comprises a polymer A, a polymer B which is different from the polymer A and a solvent. Here, said polymers and solvent are selected as the same one as in the first fine pattern-forming composition and the content ratio is selected from the same range. The content of the acid is not limited, but there is a difference in that the pH value is limited. Specifically, in the third fine pattern-forming composition the pH value is required to be 5 to 10, preferably 6 to 9.5. To adjust the pH value in the range, an acid can be used and the content of the acid may be lower than the content of the acid, required in the second fine pattern-forming composition. That is, the composition contains the acid in an amount of preferably 10 wt % or more, more preferably 20 wt % or more, particularly preferably 30 wt % or more, based on the total weight of the polymer comprising a repeating unit having an amino group in the composition, the effect of the present invention can be obtained as long as the pH value is in the specific range, even if the content of the acid is relatively low.

Pattern Formation Method

The following is an explanation of the method according to the present invention for forming a fine resist pattern. The pattern formation method described below is a typical one using the fine pattern-forming composition of the present invention.

First, a chemically amplified photoresist is cast on a surface, which may be pretreated if necessary, of a substrate, such as a silicon substrate, according to a known coating method such as spin-coating method, to form a chemically amplified photoresist layer. Prior to casting the photoresist, an antireflective coat may be beforehand formed on the substrate surface. The antireflective coat can improve the section shape and the exposure margin.

Any known chemically amplified photoresist can be used in the pattern formation method of the present invention. The chemically amplified photoresist generates an acid when exposed to radiation such as UV light, and the acid serves as a catalyst to promote chemical reaction by which solubility to an alkali developer is increased within the areas irradiated with the radiation to form a pattern. For example, the chemically amplified photoresist comprises an acid-generating compound, which generates an acid when exposed to radiation, and an acid-sensitive functional group-containing resin, which decomposes in the presence of acid to form an alkali-soluble group such as phenolic hydroxyl or carboxyl group. The photoresist may comprise an alkali-soluble resin, a crosslinking agent and an acid-generating compound.

In the present invention, the photoresist in the areas where the alkali-soluble groups are not formed is removed with an organic solvent developer to obtain a photoresist pattern. Accordingly, the obtained pattern is of a negative type, in which the resist remains in the areas exposed to radiation. This means that a negative pattern is formed from the chemically amplified photoresist that functions as a positive-working type resist when developed with a normal alkali developer.

According to necessity, the chemically amplified photoresist layer formed on the substrate is prebaked, for example, on a hot plate to remove solvent contained in the photoresist, to form a photoresist film normally having a thickness of about 50 to 500 nm. The prebaking temperature depends on the solvent and the photoresist, but is normally about 50 to 200° C., preferably about 70 to 180° C.

The photoresist film is then subjected to exposure through a mask, if necessary, by means of known exposure apparatus such as a high-pressure mercury lamp, a metal halide lamp, an ultra-high pressure mercury lamp, a KrF excimer laser, an ArF excimer laser, a soft X-ray irradiation system, and an electron beam lithography system.

After the exposure, baking treatment may be carried out, if necessary, and then development such as paddle development is carried out to form a resist pattern. In the present invention, the resist is developed with an organic solvent developer. Here, any organic solvent developer can be used as long as it does not dissolve such photoresist film in the part exposed to radiation as is solubilized in an alkaline aqueous solution but as long as it dissolves such film in the part unexposed to radiation as remains insoluble in an alkaline aqueous solution. The photoresist film in the part insoluble in an alkaline aqueous solution is generally easily dissolved in organic solvents, and hence the organic solvent developer can be selected from a relatively wide range of solvents. Actually, it can be selected from hydrocarbons and polar organic solvents such as ketones, esters, alcoholic solvents, amides and ethers.

Examples of the ketones include 1-octanone, 2-octanone, 2-nonanone, 4-heptanone, 1-hexanone, 2-hexanone, diisobutyl ketone, cyclohexanone, methyl ethyl ketone, methyl isobutyl ketone, and acetophenone.

Examples of the esters include ethyl acetate, n-propyl acetate, isopropyl acetate, n-butyl acetate, propyleneglycol monomethyl ether acetate, ethyleneglycol monoethyl ether acetate, diethyleneglycol mono-butyl ether acetate, diethyleneglycol monoethyl ether acetate, 3-methoxybutyl acetate, 3-methyl-3-methoxybutyl acetate, ethyl lactate, butyl lactate, and propyl lactate.

Examples of the alcoholic solvents include alcohols, such as ethyl alcohol, n-propyl alcohol, isopropyl alcohol, n-butyl alcohol, sec-butyl alcohol, n-hexyl alcohol, and n-heptyl alcohol; glycols, such as ethylene glycol, propylene glycol, and diethylene glycol; and glycol ethers, such as ethyleneglycol monomethyl ether, propyleneglycol monomethyl ether, diethyleneglycol monomethyl ether, triethyleneglycol monoethyl ether, and methoxymethyl butanol.

Examples of the ethers include the above glycol ethers, di-n-propyl ether, di-n-butyl ether, dioxane, and tetrahydrofuran.

Examples of the amides include N-methyl-2-pyrrolidone, N,N-dimethylacetamide, and N,N-dimethyl-formamide.

Examples of the hydrocarbons include aromatic hydrocarbons, such as toluene and xylene; and aliphatic hydrocarbons, such as pentane, hexane, octane and decane.

Those organic solvents can be used in combination of two or more, and also can be combined with inorganic solvents such as water unless they impair the effect of the present invention.

After the development, the resist pattern is preferably rinsed (washed) with a rinse solution. In the present invention, the rinsing procedure is preferably carried out with a rinse solution containing at least one organic solvent selected from the group consisting of alkanes, ketones, esters, alcohols, amides and ethers.

Examples of the rinse solution used in the rinsing procedure after the development include n-hexyl alcohol, n-heptyl alcohol and benzyl alcohol. Two or more of those solvents may be mixed, and further they may be mixed with other solvents including water.

The rinse solution may contain water in an amount of preferably 10 wt % or less, more preferably 5 wt % or less, particularly preferably 3 wt % or less. If the water content is 10 wt % or less, the development can be favorably completed. The rinse solution may contain a proper amount of surfactants.

Subsequently, the obtained resist pattern is miniaturized by applying one of the fine pattern-forming compositions of the present invention. However, prior to applying the composition, the resist pattern may be subjected to surface treatment by applying a water-based solvent comprising a surfactant or an organic solvent, which do not dissolving the pattern. As this surface treatment improves the coatability of the composition, uniform spread can be achieved, even if dropping amount of the composition is reduced. This means that the coatability can be improved without adding additives for improving the coatability, such as surfactants, into the composition. This treatment is often referred to as "pre-wet treatment".

Thereafter, the first, second or third fine pattern-forming composition of the present invention is cast so as to cover the whole resist pattern, and consequently the resist pattern is fatten or thicken by the interaction between the resist pattern and the composition. This interaction is presumed to be such impregnation of the polymer into the resist and/or such adhesion of the polymer onto the resist as fattens or thickens the resist pattern.

Specifically, the fine pattern-forming composition of the present invention soaks into and/or attaches onto the inner walls of grooves or holes in the resist pattern, to fatten or thicken the pattern. As a result, the composition narrows the width of furrow lines separating the ridges in the pattern, and thereby enables to essentially miniaturize the pitch size and hole opening size of the resist pattern more than the resolution limit.

In the pattern formation method of the present invention, the fine pattern-forming composition can be cast according to any of the coating methods conventionally adopted for casting photoresist resin compositions. For example, spin coating method can be used.

If necessary, the resist pattern coated with the fine pattern-forming composition can be heated by prebaking. The prebaking may be carried out while the temperature is either kept constant or elevated step-by-step. After coated with the fine pattern-forming composition, the resist pattern is heated at, for example, 40 to 200° C., preferably 80 to 160° C., for 10 to 300 seconds, preferably 30 to 120 seconds. This heating procedure is for the purpose of helping the polymer to soak into and/or attach onto the resist.

As a result of casting and heating the fine pattern-forming composition, the resist pattern is so fattened as to increase the width of the ridge lines in the pattern and to decrease the diameter of the hole pattern. Those dimension changes can be adequately controlled by selecting the conditions such as the temperature and time of heating, the kind of the photoresist resin composition and the like. Accordingly, the conditions are determined according to how far the resist pattern must be miniaturized, namely, how much the width of the ridge lines in the resist pattern must be broadened and/or how much the diameter of the hole pattern must be reduced. However, each dimension change in the resist pattern normally ranges from 5 to 30 nm in difference between before and after application of the fine pattern-forming composition.

After the resist pattern is essentially miniaturized, the fine pattern-forming composition unreacted with the resist, namely, excess of the composition can be rinsed away with water or solvents, if necessary. The water or solvents for rinsing must have poor ability to dissolve the fine pattern-forming composition soaked into or attached onto the resist pattern but must have high ability to dissolve the extra composition, which is neither soaked into nor attached onto the resist pattern. It is preferred to use a solvent contained in the fine pattern-forming composition, and it is particularly preferred to use pure water for rinsing.

In the way described above, the resist pattern immediately after developed undergoes dimension change by the action of the fine pattern-forming composition, so as to obtain an essentially miniaturized resist pattern. The resist pattern thus produced by use of the fine pattern-forming composition according to the present invention is advantageously used in producing semiconductor devices or the like having finer patterns.

The present invention is further explained by use of the following examples.

Resist Pattern Formation Example 1

An 8-inch silicon wafer was spin-coated with a bottom antireflective coat-forming composition (AZ ArF-1C5D [trademark], manufactured by AZ Electronic Materials (Japan) K.K.) by means of a spin coater (manufactured by Tokyo Electron Ltd.), and then baked at 200° C. for 60 seconds to form an antireflective coat of 37 nm thickness. Subsequently, a photosensitive resin composition (AZ AX2110P [trademark], manufactured by AZ Electronic Materials (Japan) K.K.) was cast thereon and baked at 110° C. for 60 seconds to form a resist layer of 120 nm thickness. The obtained wafer was subjected to pattern exposure through a mask (line/space=1/1) by means of an ArF-beam (193 nm) exposure apparatus (manufactured by Nikon Corporation). After baked at 110° C. for 60 seconds, the wafer was then subjected to development (negative development) for 30 seconds by use of 2-heptanone as a developer, to obtain a resist pattern having a pitch size of 160 nm and a line width size of 80 nm.

Preparation of Fine Pattern-Forming Compositions (I)

The following polymers were prepared:
polyvinylamine (weight average molecular weight: 25,000),
polyallylamine (weight average molecular weight: 25,000),
polydiallylamine (weight average molecular weight: 5,000),
polyethyleneimine (weight average molecular weight: 10,000, Polyethyleneimine 10,000 [trademark], manufactured by Junsei Chemical Co., Ltd.), and
poly(allylamine-co-diallylamine (weight average molecular weight: 30,000, ratio of allylamine:diallylamine=1:1 (molar ratio).

Each of the above polymers, the surfactant represented by the following formula (1), and an acid were dissolved in water to prepare fine pattern-forming compositions. The surfactant was polyoxyethylene nonylphenyl ether represented by the following formula (1), and the amount thereof was 0.05 wt % based on the weight of the composition. The kind and amount of the polymer and the acid were shown in Tables 1 to 5.

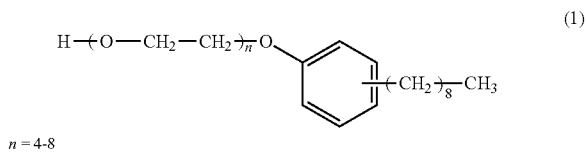

(1)

$n = 4-8$

Formation and Evaluation of Miniaturized Resist Patterns (I)

Each prepared composition was cast on the resist pattern 1 by means of a spin coater, and heated at 140° C. for 60 seconds. The pattern coated with the composition was washed with pure water, and then dried. The dimension of the obtained line pattern was measured to evaluate the increased amount of the line pattern by the fine pattern-forming composition. Here, the increased amount of the line pattern means for the difference calculated by subtracting the width of the line pattern, obtained before applying to the fine pattern-forming composition, from the width of the line pattern, obtained after applying to the composition.

Further, the substrate on which the pattern was formed was observed by means of KLA system (manufactured by KLA-Tencor Corporation) to evaluate defects, and the results were classified into the following grades:

A: no defects were observed, and there was no problem to use the substrate in producing semiconductor devices;

B: some defects were observed, but there was no problem to use the substrate in producing semiconductor devices; and C: many defects were observed, and they made it difficult to use the substrate in producing semiconductor devices.

TABLE 1 polymer: polyvinylamine, content: 3.0 wt %

| | Acid | | Evaluation | |
|---|---|---|---|---|
| | Substance | Content (wt %) | Defects | Increment of line patten (nm) |
| Com. 101 | — | — | C | 11 |
| Com. 102 | methanesulfonic acid | 20 | C | 11 |
| Com. 103 | methanesulfonic acid | 40 | C | 11 |
| Com. 104 | p-toluenesulfonic acid | 20 | C | 11 |
| Com. 105 | p-toluenesulfonic acid | 40 | C | 9 |
| Com. 106 | nitric acid | 20 | C | 11 |
| Com. 107 | nitric acid | 40 | C | 10 |
| Ex. 101 | sulfuric acid | 50 | A | 9 |
| Ex. 102 | methanesulfonic acid | 50 | A | 10 |
| Ex. 103 | ethanesulfonic acid | 50 | A | 8 |
| Ex. 104 | 2-aminoethanesulfonic acid | 50 | A | 9 |
| Ex. 105 | trifluoromethanesulfonic acid | 50 | A | 10 |
| Ex. 106 | p-toluenesulfonic acid | 50 | A | 10 |
| Ex. 107 | 10-camphorsulfonic acid | 50 | A | 9 |
| Ex. 108 | acetic acid | 50 | B | 9 |
| Ex. 109 | methoxyacetic acid | 50 | B | 8 |
| Ex. 110 | glycolic acid | 50 | B | 9 |
| Ex. 111 | glutaric acid | 50 | A | 8 |
| Ex. 112 | malic acid | 50 | A | 8 |
| Ex. 113 | nitric acid | 50 | A | 10 |
| Ex. 114 | methanesulfonic acid | 60 | A | 10 |
| Ex. 115 | p-toluenesulfonic acid | 60 | A | 10 |
| Ex. 116 | acetic acid | 60 | A | 10 |
| Ex. 117 | methanesulfonic acid | 150 | A | 9 |
| Ex. 118 | methanesulfonic acid | 180 | A | 8 |

TABLE 2 polymer: polyallylamine, content: 3.0 wt %

| | Acid | | Evaluation | |
|---|---|---|---|---|
| | Substance | Content (wt %) | Defects | Increment of line patten (nm) |
| Com. 101 | — | — | C | 15 |
| Com. 102 | sulfuric acid | 20 | C | 14 |
| Com. 103 | sulfuric acid | 40 | C | 13 |
| Com. 104 | p-toluenesulfonic acid | 20 | C | 14 |
| Com. 105 | p-toluenesulfonic acid | 40 | C | 13 |
| Com. 106 | 10-camphorsulfonic acid | 20 | C | 14 |
| Com. 107 | 10-camphorsulfonic acid | 40 | C | 14 |
| Com. 108 | acetic acid | 20 | C | 14 |
| Com. 109 | acetic acid | 40 | C | 14 |
| Com. 110 | nitric acid | 20 | C | 13 |
| Com. 111 | nitric acid | 40 | C | 12 |
| Ex. 101 | sulfuric acid | 50 | A | 12 |
| Ex. 102 | methanesulfonic acid | 50 | A | 13 |
| Ex. 103 | ethanesulfonic acid | 50 | A | 13 |
| Ex. 104 | 2-aminoethanesulfonic acid | 50 | A | 10 |
| Ex. 105 | trifluoromethanesulfonic acid | 50 | A | 12 |
| Ex. 106 | p-toluenesulfonic acid | 50 | A | 13 |
| Ex. 107 | 10-camphorsulfonic acid | 50 | A | 14 |
| Ex. 108 | acetic acid | 50 | B | 14 |
| Ex. 109 | methoxyacetic acid | 50 | B | 10 |
| Ex. 110 | glycolic acid | 50 | B | 11 |
| Ex. 111 | glutaric acid | 50 | A | 11 |
| Ex. 112 | malic acid | 50 | A | 10 |

TABLE 2-continued polymer: polyallylamine, content: 3.0 wt %

| | Acid | | Evaluation | |
|---|---|---|---|---|
| | Substance | Content (wt %) | Defects | Increment of line patten (nm) |
| Ex. 113 | nitric acid | 50 | A | 12 |
| Ex. 114 | methanesulfonic acid | 60 | A | 13 |
| Ex. 115 | p-toluenesulfonic acid | 60 | A | 13 |
| Ex. 116 | acetic acid | 60 | A | 12 |
| Ex. 117 | methanesulfonic acid | 150 | A | 11 |
| Ex. 118 | methanesulfonic acid | 180 | A | 9 |

TABLE 3 polymer: polydiallylamine, content: 3.0 wt %

| | Acid | | Evaluation | |
|---|---|---|---|---|
| | Substance | Content (wt %) | Defects | Increment of line patten (nm) |
| Com. 101 | — | — | C | 7 |
| Com. 102 | methanesulfonic acid | 20 | C | 7 |
| Com. 103 | methanesulfonic acid | 40 | C | 6 |
| Com. 104 | p-toluenesulfonic acid | 20 | C | 9 |
| Com. 105 | p-toluenesulfonic acid | 40 | C | 8 |
| Com. 106 | nitric acid | 20 | C | 7 |
| Com. 107 | nitric acid | 40 | C | 7 |
| Ex. 101 | sulfuric acid | 50 | A | 7 |
| Ex. 102 | methanesulfonic acid | 50 | A | 5 |
| Ex. 103 | ethanesulfonic acid | 50 | A | 5 |
| Ex. 104 | 2-aminoethanesulfonic acid | 50 | A | 4 |
| Ex. 105 | trifluoromethanesulfonic acid | 50 | A | 6 |
| Ex. 106 | p-toluenesulfonic acid | 50 | A | 5 |
| Ex. 107 | 10-camphorsulfonic acid | 50 | B | 7 |
| Ex. 108 | acetic acid | 50 | B | 8 |
| Ex. 109 | methoxyacetic acid | 50 | B | 7 |
| Ex. 110 | glycolic acid | 50 | B | 7 |
| Ex. 111 | glutaric acid | 50 | B | 7 |
| Ex. 112 | malic acid | 50 | B | 8 |
| Ex. 113 | nitric acid | 50 | A | 8 |
| Ex. 114 | methanesulfonic acid | 60 | A | 5 |
| Ex. 115 | p-toluenesulfonic acid | 60 | A | 5 |
| Ex. 116 | acetic acid | 60 | A | 7 |
| Ex. 117 | methanesulfonic acid | 150 | A | 5 |
| Ex. 118 | methanesulfonic acid | 180 | A | 5 |

TABLE 4 polymer: polyethyleneimine, content: 3.0 wt %

| | Acid | | Evaluation | |
|---|---|---|---|---|
| | Substance | Content (wt %) | Defects | Increment of line patten (nm) |
| Com. 101 | — | — | C | 10 |
| Com. 102 | methanesulfonic acid | 20 | C | 9 |
| Com. 103 | methanesulfonic acid | 40 | C | 9 |
| Com. 104 | p-toluenesulfonic acid | 20 | C | 8 |
| Com. 105 | p-toluenesulfonic acid | 40 | C | 7 |
| Com. 106 | nitric acid | 20 | C | 10 |

TABLE 4-continued polymer: polyethyleneimine, content: 3.0 wt %

| | Acid | | Evaluation | |
|---|---|---|---|---|
| Substance | | Content (wt %) | Defects | Increment of line patten (nm) |
| Com. 107 | nitric acid | 40 | C | 9 |
| Com. 108 | sulfuric acid | 20 | C | 10 |
| Com. 109 | methanesulfonic acid | 40 | C | 9 |
| Com. 110 | ethanesulfonic acid | 20 | C | 10 |
| Com. 111 | 2-aminoethanesulfonic acid | 40 | C | 9 |
| Ex. 101 | sulfuric acid | 50 | A | 9 |
| Ex. 102 | methanesulfonic acid | 50 | A | 8 |
| Ex. 103 | ethanesulfonic acid | 50 | A | 8 |
| Ex. 104 | 2-aminoethanesulfonic acid | 50 | A | 9 |
| Ex. 105 | trifluoromethanesulfonic acid | 50 | A | 7 |
| Ex. 106 | p-toluenesulfonic acid | 50 | A | 7 |
| Ex. 107 | 10-camphorsulfonic acid | 50 | A | 9 |
| Ex. 108 | acetic acid | 50 | B | 9 |
| Ex. 109 | methoxyacetic acid | 50 | B | 8 |
| Ex. 110 | glycolic acid | 50 | B | 9 |
| Ex. 111 | glutaric acid | 50 | A | 9 |
| Ex. 112 | malic acid | 50 | A | 9 |
| Ex. 113 | nitric acid | 50 | A | 9 |
| Ex. 114 | methanesulfonic acid | 60 | A | 8 |
| Ex. 115 | p-toluenesulfonic acid | 60 | A | 7 |
| Ex. 116 | acetic acid | 60 | A | 7 |
| Ex. 117 | methanesulfonic acid | 150 | A | 6 |
| Ex. 118 | methanesulfonic acid | 180 | A | 5 |

TABLE 5 polymer: poly(allylamine-co-diallylamine), content: 3.0 wt %

| | Acid | | Evaluation | |
|---|---|---|---|---|
| Substance | | Content (wt %) | Defects | Increment of line patten (nm) |
| Com. 101 | — | — | C | 15 |
| Com. 102 | methanesulfonic acid | 20 | C | 13 |
| Com. 103 | methanesulfonic acid | 40 | C | 13 |
| Com. 104 | p-toluenesulfonic acid | 20 | C | 15 |
| Com. 105 | p-toluenesulfonic acid | 40 | C | 14 |
| Com. 106 | nitric acid | 20 | C | 14 |
| Com. 107 | nitric acid | 40 | C | 13 |
| Ex. 101 | sulfuric acid | 50 | A | 12 |
| Ex. 102 | methanesulfonic acid | 50 | A | 13 |
| Ex. 103 | ethanesulfonic acid | 50 | A | 13 |
| Ex. 104 | 2-aminoethanesulfonic acid | 50 | A | 10 |
| Ex. 105 | trifluoromethanesulfonic acid | 50 | A | 13 |
| Ex. 106 | p-toluenesulfonic acid | 50 | A | 13 |
| Ex. 107 | 10-camphorsulfonic acid | 50 | A | 14 |
| Ex. 108 | acetic acid | 50 | B | 14 |
| Ex. 109 | methoxyacetic acid | 50 | B | 12 |
| Ex. 110 | glycolic acid | 50 | B | 12 |
| Ex. 111 | glutaric acid | 50 | B | 12 |
| Ex. 112 | malic acid | 50 | A | 13 |
| Ex. 113 | nitric acid | 50 | A | 13 |
| Ex. 114 | methanesulfonic acid | 60 | A | 13 |
| Ex. 115 | p-toluenesulfonic acid | 60 | A | 13 |
| Ex. 116 | acetic acid | 60 | A | 13 |
| Ex. 117 | methanesulfonic acid | 150 | A | 11 |
| Ex. 118 | methanesulfonic acid | 180 | A | 10 |

Resist Pattern Formation Example 2

An 8-inch silicon wafer was spin-coated with a bottom antireflective coat-forming composition (AZ ArF-1C5D [trademark], manufactured by AZ Electronic Materials (Japan) K.K.) by means of a spin coater (manufactured by Tokyo Electron Ltd.), and then baked at 200° C. for 60 seconds to form an antireflective coat of 37 nm thickness. Subsequently, a photosensitive resin composition (AZ AX2110P [trademark], manufactured by AZ Electronic Materials (Japan) K.K.) was cast thereon and baked at 110° C. for 60 seconds to form a resist layer of 120 nm thickness. The obtained wafer was subjected to pattern exposure through a mask having Iso/Dense pattern (line/space 1/1 and 3/1) by means of an ArF-beam (193 nm) exposure apparatus (manufactured by Nikon Corporation). After baked at 110° C. for 60 seconds, the wafer was then subjected to development (negative development) for 30 seconds by use of 2-heptanone as a developer, to obtain a dense pattern (resist pattern having a pitch size of 160 nm and a line width size of 80 nm) and an iso pattern (resist pattern having a pitch size of 320 nm and a line width size of 240 nm).

Preparation of Fine Pattern-Forming Compositions (II)

The following polymers were prepared:

polyacrylic acid (weight average molecular weight: 38,000)

polyoxyethylene (weight average molecular weight: 95,000)

polyvinylamine (weight average molecular weight: 25,000), polyallylamine (weight average molecular weight: 25,000), polyvinylimidazole (weight average molecular weight: 70,000), and polyethyleneimine (weight average molecular weight: 10,000, Polyethyleneimine 10000 [trademark], manufactured by Junsei Chemical Co., Ltd.).

Each of the above polymers, a surfactant, and a methanesufonic acid were dissolved in water to prepare fine pattern-forming compositions, the amount of polymers was 3.0 wt %. The amount of the polymer and the acid and pH were shown in Tables 6.

Formation and Evaluation of Miniaturized Resist Patterns (II)

Each prepared composition was cast on the resist pattern having Iso/Dense by means of a spin coater, and heated at 140° C. for 60 seconds. The pattern coated with the composition was washed with pure water, and then dried. The dimensional shrinkage of the obtained line pattern was measured and defects on the pattern were observed. The obtained results were shown in Table 6. In the table, X means for the increased amount of the resist pattern in the dense part and Y means for the increased amount of the resist pattern in the iso part

TABLE 6

| | Composition | | | | | Increased amount of line width (nm) | | | | |
|---|---|---|---|---|---|---|---|---|---|---|
| | Polymer A | Polymer B | | Acid | | | | | | |
| | (content) (wt %) | (content) (wt %) | HSP distance | Content (wt %) | pH | X | Y | Difference X − Y | Defects evalutation | Comprehensive evaluation |
| Com. 201 | PAA(80) | POE(20) | 7.60 | 50 | 3.0 | Pattern was dissolved. Not evaluated. | | | | unsuitable |
| Com. 202 | PVAm(90) | PVI(10) | 10.45 | 5 | 10.5 | 13 | 12 | 1 | C | unsuitable |
| Com. 203 | PVAm(50) | PAAm(50) | 2.66 | 25 | 9.7 | 15 | 10 | 5 | A | unsuitable |
| Ex. 201 | PVAm(50) | PVI(50) | 10.45 | 10 | 9.5 | 12 | 11 | 1 | A | suitable |
| Ex. 202 | PVAm(20) | PVI(80) | 10.45 | 20 | 9.2 | 11 | 11 | 0 | A | suitable |
| Ex. 203 | PVAm(80) | PEI(20) | 5.62 | 50 | 8.9 | 10 | 11 | 1 | A | suitable |
| Ex. 204 | PVAm(20) | POE(80) | 8.60 | 70 | 5.2 | 9 | 9 | 0 | A | suitable |

PAA: polyacrylic acid (not having an amino group)
POE: polyoxyethylene (not having an amino group)
PVAm: polyvinylamine
PAAm: polyallylamine
PVI: polyvinylimidazole

The invention claimed is:

1. A method for forming a miniaturized positive resist pattern, comprising the steps of:
    coating a semiconductor substrate with a chemically amplified photoresist composition, to form a photoresist layer;
    exposing said semiconductor substrate coated with said photoresist layer;
    developing said photoresist layer with an organic solvent developer after said exposing step, to form a photoresist pattern;
    coating said photoresist pattern with a fine pattern-forming composition containing a polymer comprising a repeating unit having an amino group, an acid in an amount of more than 50 wt % to 200 wt % or less based on the weight of said polymer, provided that said acid does not comprise a carboxylic acid, and a solvent, wherein the polymer is selected from the group consisting of polyvinylamine, polylallylamine, polydiallylamine, and poly(allylamine-co-diallylamine);
    heating the coated photoresist pattern; and
    washing to remove excess of the fine pattern-forming composition.

2. The method according to claim 1, wherein in said fine pattern-forming composition, said polymer is selected from polyvinylamine, or polyallylamine.

3. The method according to claim 1, wherein in said fine pattern-forming composition, said polymer is selected from the group consisting of polyvinylamine, polyallylamine, and polydiallylamine.

4. The method according to claim 1, wherein in said fine pattern-forming composition, said acid is selected from the group consisting of a sulfonic acid, sulfuric acid, nitric acid, and mixtures thereof.

5. The method according to claim 4, wherein in said fine pattern-forming composition, said sulfonic acid is selected from the group consisting of methanesulfonic acid, ethanesulfonic acid, 2-am inomethanesulfonic acid, trifluoromethanesulfonic acid, p-toluenesulfonic acid, and 10-camphorsulfonic acid.

6. The method according to claim 1, wherein in said fine pattern-forming composition, said solvent contains water.

7. The method according to claim 1, wherein in said fine pattern-forming composition which further contains a surfactant.

8. The method according to claim 1 for forming a miniaturized negative resist pattern, wherein said photoresist composition further comprises a photo acid-generating agent.

9. The method according to claim 1, wherein in said fine pattern-forming composition, said acid comprises at least one selected from the group consisting of a sulfonic acid, and an inorganic acid.

10. The method according to claim 1, wherein in said fine pattern-forming composition, said acid comprises at least one from the group consisting methanesulfonic acid, ethanesulfonic acid, 2-aminoethanesulfonic acid, trifluoromethanesulfonic acid, p-toluenesulfonic acid, 10-camphorsulfonic acid, sulfuric acid, nitric acid, and hydrochloric acid.

11. The method according to claim 1, wherein said polymer is polylallylamine, and said polymer is in an amount of 0.1 to 10 wt % based on the total weight of the fine pattern-forming composition, and further said acid is in an amount ranging from 60 wt % to 200 wt % based on the weight of said polymer, and further wherein, the fine pattern-forming composition comprises a surfactant, and the surfactant amount is 0.1 wt % or less based on the total weight of the fine pattern-forming composition.

12. A method for manufacturing semiconductors, comprising the steps of the miniaturized positive resist pattern forming method according to claim 1.

* * * * *